(12) United States Patent
Chen

(10) Patent No.: US 8,897,468 B2
(45) Date of Patent: Nov. 25, 2014

(54) NOISE CONTROL CIRCUIT AND AUDIO RECEIVING SYSTEM USING THE SAME

(75) Inventor: Hao Chen, Shenzhen (CN)

(73) Assignees: Shenzhen Futaihong Precision Industry Co., Ltd., Shenzhen (CN); Chi Mei Communication Systems, Inc., New Taipei (TW)

( * ) Notice: Subject to any disclaimer, the term of this patent is extended or adjusted under 35 U.S.C. 154(b) by 747 days.

(21) Appl. No.: 13/085,437

(22) Filed: Apr. 12, 2011

(65) Prior Publication Data

US 2012/0163611 A1      Jun. 28, 2012

(30) Foreign Application Priority Data

Dec. 28, 2010   (CN) .......................... 2010 1 0609209

(51) Int. Cl.
*H03F 21/00*   (2006.01)
*H03G 3/32*   (2006.01)
*H03G 3/34*   (2006.01)

(52) U.S. Cl.
CPC ............ *H03G 3/341* (2013.01); *H03F 2200/03* (2013.01); *H03G 3/32* (2013.01); *H03F 2203/7215* (2013.01)
USPC ...................................... 381/120; 330/125 R

(58) Field of Classification Search
CPC ......... H03F 1/086; H03F 1/342; H03F 3/265; H03F 3/3018; H03F 3/3001; H03F 2200/03; H03F 2203/45526; H03F 2203/45568; H03F 2203/45571; H03F 2203/7215; H03F 3/02; H03F 3/187; H03F 3/45475; H03F 5/00
USPC ......... 381/56–58, 71.1–71.7, 94.1–94.4, 104, 381/123, 120, 110, 11; 330/251–254, 281, 330/277, 125 R, 311
See application file for complete search history.

(56) References Cited

U.S. PATENT DOCUMENTS

| | | | | |
|---|---|---|---|---|
| 3,410,958 A | * | 11/1968 | Cohen .............................. | 381/57 |
| 3,538,253 A | * | 11/1970 | Braun ........................... | 704/226 |
| 3,634,626 A | * | 1/1972 | Staley .............................. | 381/11 |
| 3,870,829 A | * | 3/1975 | Chacon .......................... | 307/115 |
| 4,281,295 A | * | 7/1981 | Nishimura et al. ............. | 333/14 |
| 5,736,897 A | * | 4/1998 | Gagon ........................... | 330/126 |

* cited by examiner

*Primary Examiner* — Lun-See Lao
(74) *Attorney, Agent, or Firm* — Novak Druce Connolly Bove + Quigg LLP

(57) ABSTRACT

A noise control circuit includes a filter, a rectifier and a switch. The filter receives audio signals and obtains a noise signal portion of the received audio signals. The rectifier converts the noise signal portion to a current signal. The switch controls output of the audio signals according to an intensity of the current signals.

9 Claims, 3 Drawing Sheets

NOISE CONTROL CIRCUIT AND AUDIO RECEIVING SYSTEM USING THE SAME

BACKGROUND

1. Technical Field

The disclosure generally relates to noise control, and particularly to a noise control circuit used in an audio receiving system of a portable electronic device.

2. Description of Related Art

Portable electronic devices, such as mobile phones, are widely used in everyday life. When people use mobile phones for communication, audio signals are transmitted from a sender to a receiver. The audio signals may include a voice signal portion which is desired to be sent to the receiver and a noise signal portion. When the audio sender is talking using the receiver, the sender may mute the call if required, during the communication. However, in the mute mode, the main portion of the audio signal is the noise signal portion. The noise signal portion may mix with noise generated by the receiver and creates strong interference for the receiver.

Therefore, there is room for improvement within the art.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure.

DETAILED DESCRIPTION

Figure 1:
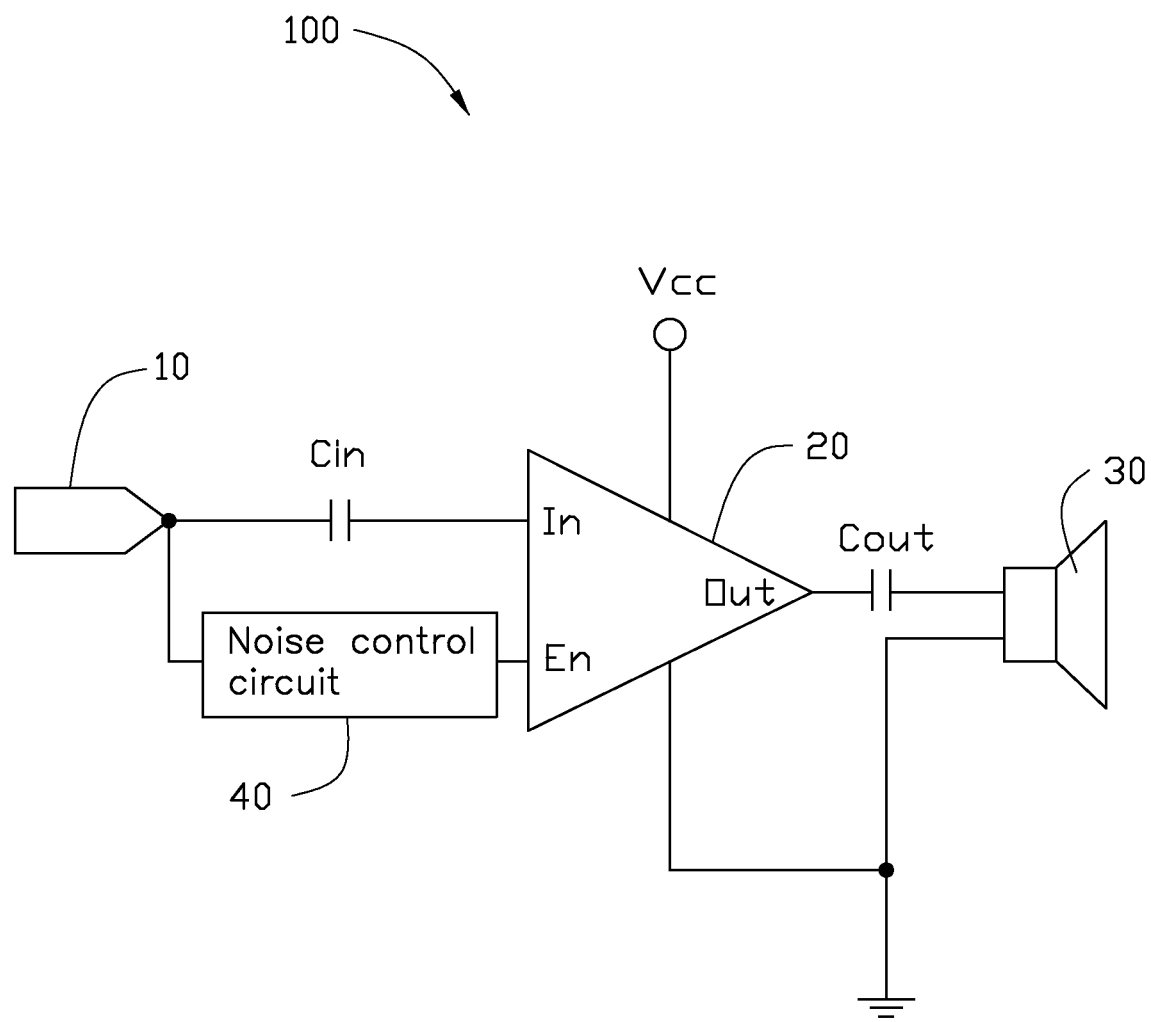
FIG. 1 is a circuit diagram of an audio receiving system, according to an exemplary embodiment.

FIG. 1 shows a circuit diagram of an audio receiving system 100, according to an exemplary embodiment. The audio receiving system 100 includes an audio receiving terminal 10, an audio amplifier 20, a speaker 30, a noise control circuit 40, an input coupling capacitor Cin and an output coupling capacitor Cout.

The terminal receiving terminal 10 receives audio signals from a sender during the use of the portable electronic device to make a call for the sender. The audio signals include a voice signal portion and a noise signal portion. The voice signal portion is desired to be received from the sender and the noise signal portion is unwanted noise generated during transmission or reception of the audio signals. The terminal receiving terminal 10 transmits the received audio signals to the audio amplifier 20.

The audio amplifier 20 includes a power input terminal (not labeled), an audio signal input terminal In, an audio signal output terminal Out and an enable control terminal En. The power input terminal is connected to a power supply Vcc. The audio signal input terminal In is connected to the audio receiving terminal 10. The audio signal output terminal Out is connected to the speaker 30. The audio signals can be amplified by the audio amplifier 20, and then output to the speaker 30.

The noise control circuit 40 is set between the audio receiving terminal 10 and the enable control terminal En. The noise control circuit 40 receives the audio signals from the audio receiving terminal 10 and controls the on/off states of the audio amplifier 20 according to intensity of the noise signal portion of the received audio signals, thus, controls the speaker 30 to output the audio signals or not.

The input coupling capacitor Cin is set between the audio receiving terminal 10 and the audio input terminal 22. The output coupling capacitor Cout is set between the audio receiving terminal 10 and the speaker 30. The input coupling capacitor Cin and the output coupling capacitor Cout filters direct current signals in the audio signal received by the audio receiving terminal 10 or the signals amplified by the audio amplifier 20.

Figure 2:
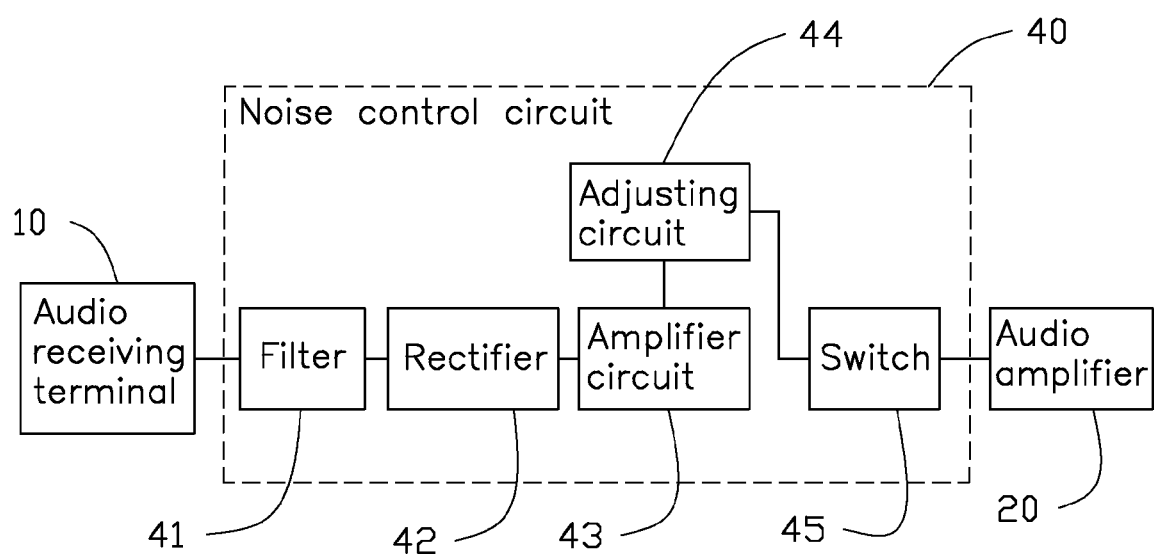
FIG. 2 is a block diagram of a noise control circuit of the audio receiving system in FIG. 1, according to an exemplary embodiment.
Figure 3:
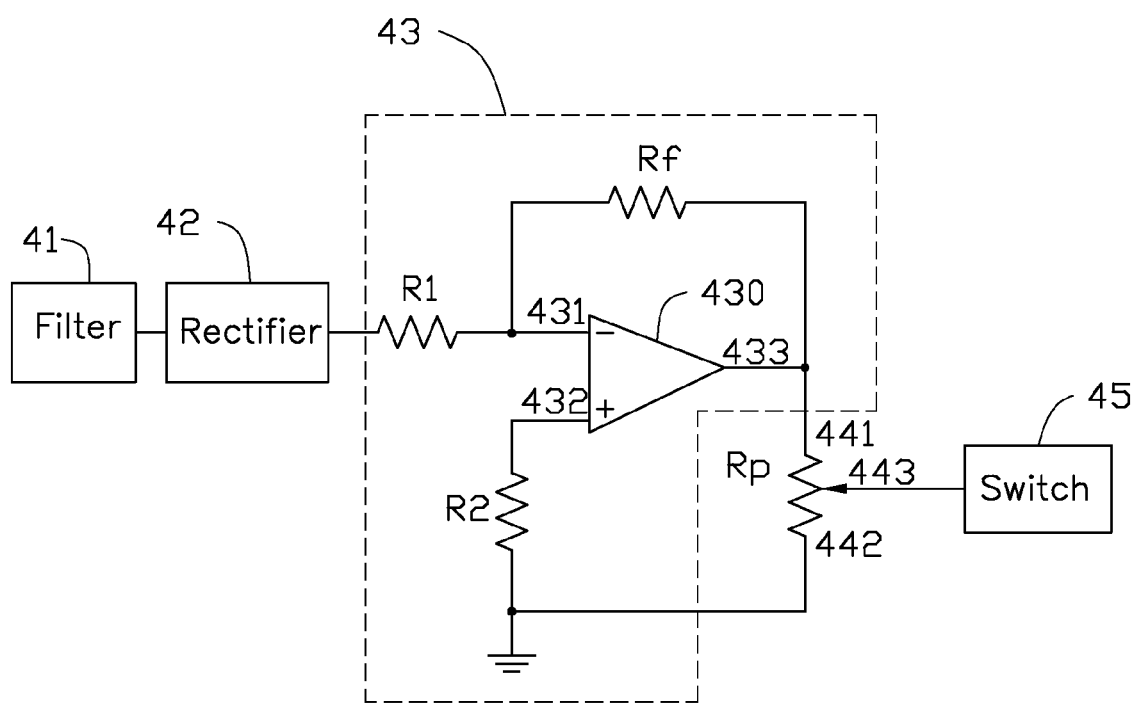
FIG. 3 is a partial circuit diagram of the noise control circuit in FIG. 2.

Referring to FIGS. 2 and 3, the noise control circuit 40 includes a filter 41, a rectifier 42, an amplifier circuit 43, an adjusting circuit 44, and a switch 45 connected in series.

The filter 41 is connected to the audio receiving terminal 10. The filter 41 filters the voice signal portion of the audio signals received by the audio receiving terminal 10 to filter out the voice signal portion and obtain the noise signal portion of the audio signals.

The rectifier 42 converts the noise signal portion into a current signal and inputs the current signal to the amplifying circuit 43.

The amplifying circuit 43 includes an amplifier 430, a first resistor R1, a second resistor R2 and an adjusting resistor Rf. The amplifier 430 includes an inverting input terminal 431, a non-inverting input terminal 432, and an amplifying output terminal 433. The inverting input terminal 431 is connected to the rectifier 42 by the first resistor R1. The non-inverting input terminal 432 is grounded by the second resistor R2. The adjusting resistor Rf is set between the inverting input terminal 431 and the amplifying output terminal 433. The current signal which comprises the noise signal portion is amplified by the amplifier 43.

The adjusting circuit 44 includes a variable resistor Rp. The variable resistor Rp includes two connecting terminals 441, 442 and an adjusting terminal 443. The connecting terminal is connected to the amplifying output terminal 433. The connecting terminal is grounded. The adjusting terminal 443 is connected to the switch 45. The current signal can be adjusted by changing the resistance of the variable resistor Rp.

One end of the switch 45 is connected to the adjusting terminal 443. Another end of the switch 45 is connected to the enable terminal En of the audio amplifier 20. The switch 45 may be a Schmitt trigger and includes a predetermined current signal intensity range. When the intensity of the current signal is within the predetermined current signal intensity range, which means that the intensity of the noise signal portion is normal, and the sender is in a normal communication mode, the switch 45 turns on the audio amplifier 20. When the intensity of the current signal is outside the predetermined current signal intensity range, which shows that the intensity of the noise signal portion is abnormal, and the sender has muted the call, the switch 45 turns off the audio amplifier 20.

While making a call for the sender, the audio signals are input from the audio receiving terminal 10. The filter 41 filters the voice signal portion of the audio signals and obtains the noise signal portion. The rectifier 42 converts the noise signal portion into the current signal. The amplifier circuit 43 amplifies the current signal. The adjusting circuit 44 adjusts the intensity of the current signal. The switch 45 turns on/off the audio amplifier 20 according to the intensity of the adjusted current signal.

When the sender is in a normal communication mode, the intensity of the current signal is within the predetermined current signal intensity range, the switch 45 turns on the audio amplifier 20. Thus, the audio signals can be output by the speaker 30.

When the sender has muted the call, the intensity of the current signals is outside the predetermined current signal intensity range, the switch 45 turns off the audio amplifier 20. Thus, the audio signals cannot be output by the speaker 30. The speaker 30 effectively reduces the noise interference because the noise signal portion would not be output.

It is believed that the exemplary embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A noise control circuit, comprising:
a filter that receives audio signals and obtains a noise signal portion of the received audio signals;
a rectifier that converts the noise signal portion into a current signal;
an amplifying circuit comprising an amplifier, the amplifier comprising an inverting input terminal, a non-inverting input terminal, and an amplifying output terminal, the inverting input terminal being connected to the rectifier, the non-inverting input terminal being grounded;
a switch that controls output of the audio signals according to intensity of the current signal; and
an adjusting circuit comprising a variable resistor, the variable resistor comprising two connecting terminals and an adjusting terminal, one of the connecting terminals being connected to the amplifying output terminal, another connecting terminal being grounded, and the adjusting terminal being connected to the switch;
wherein the amplifying circuit further includes a first resistor, a second resistor and an adjusting resistor; the inverting input terminal is connected to the rectifier by the first resistor, the non-inverting input terminal is grounded by the second resistor, the adjusting resistor is set between the inverting input terminal and the amplifying output terminal.

2. The noise control device as claimed in claim 1, wherein the switch includes a predetermined current signal intensity range, when the intensity of the current signals is within the predetermined current signal intensity range, the switch controls output of the audio signal; when the intensity of the current signals is outside the predetermined current signal intensity range, the switch controls the audio signal to stop outputting the audio signal.

3. The noise control device as claimed in claim 1, wherein the switch is a Schmitt trigger.

4. An audio receiving system, comprising:
an audio receiving terminal receiving audio signals, the received audio signals comprising a noise signal portion and a voice signal portion;
an audio amplifier amplifying the audio signals;
a noise control circuit turning off/on the audio amplifier according to a noise signal portion of the received audio signals, the noise control circuit comprising:
a filter that receives audio signals and obtains the noise signal portion of the received audio signals;
a rectifier that converts the noise signal portion into a current signal;
an amplifying circuit comprising an amplifier, the amplifier comprising an inverting input terminal, a non-inverting input terminal, and an amplifying output terminal, the inverting input terminal being connected to the rectifier, the non-inverting input terminal being grounded;
a switch that controls output of the audio signals according to intensity of the current signals; and
an adjusting circuit comprising a variable resistor, the variable resistor comprising two connecting terminals and an adjusting terminal, one of the connecting terminals being connected to the amplifying output terminal, another connecting terminal being grounded, and the adjusting terminal being connected to the switch; and
a speaker outputting the audio signals amplified by the audio amplifier;
wherein the amplifying circuit further includes a first resistor, a second resistor and an adjusting resistor; the inverting input terminal is connected to the rectifier by the first resistor, the non-inverting input terminal is grounded by the second resistor, the adjusting resistor is set between the inverting input terminal and the amplifying output terminal.

5. The audio receiving system as claimed in claim 4, wherein the switch includes a predetermined current signal intensity range, when the intensity of the current signals is within the predetermined current signal intensity range, the switch controls output of the audio signal; when the intensity of the current signals is outside the predetermined current signal intensity range, the switch controls the audio signal to stop outputting the audio signal.

6. The audio receiving system as claimed in claim 4, wherein the switch is a Schmitt trigger.

7. A noise control circuit, comprising:
a filter that receives audio signals and obtains a noise signal portion of the received audio signals;
a rectifier that converts the noise signal portion into a current signal;
an amplifying circuit connected to the rectifier and amplifying the current signal, wherein the amplifying circuit includes an amplifier, a first resistor, a second resistor and an adjusting resistor; the amplifier includes an inverting input terminal, a non-inverting input terminal, and an amplifying output terminal, the inverting input terminal is connected to the rectifier by the first resistor, the non-inverting input terminal is grounded by the second resistor, and the adjusting resistor is set between the inverting input terminal and the amplifying output terminal; and
a switch that controls output of the audio signals according to intensity of the current signal; wherein the switch comprises a predetermined current signal intensity range, when the intensity of the current signals is within the predetermined current signal intensity range, the switch controls output of the audio signal; when the intensity of the current signals is outside the predetermined current signal intensity range, the switch controls the audio signal to stop outputting the audio signal.

8. The noise control device as claimed in claim 7, further comprising an adjusting circuit, wherein the adjusting circuit includes a variable resistor, and the intensity of the current signal can be adjusted by changing resistance of the variable resistor.

9. The noise control device as claimed in claim 8, wherein the variable resistor includes two connecting terminals and an adjusting terminal, one of the connecting terminals is connected to the amplifying circuit, another connecting terminal is grounded, and the adjusting terminal is connected to the switch.

* * * * *